United States Patent
Zha

(10) Patent No.: US 6,456,058 B1
(45) Date of Patent: Sep. 24, 2002

(54) TEMPERATURE STABLE INTEGRATED CIRCUIT FULL WAVE LEVEL DETECTOR INCORPORATING A SINGLE OPERATIONAL AMPLIFIER STAGE DESIGN

(75) Inventor: Gang Zha, Shenzhen (CN)

(73) Assignee: Shenzhen STS Microelectronics Co. Ltd. (CN)

( * ) Notice: Subject to any disclaimer, the term of this patent is extended or adjusted under 35 U.S.C. 154(b) by 43 days.

(21) Appl. No.: 09/643,157

(22) Filed: Aug. 21, 2000

(30) Foreign Application Priority Data

Sep. 2, 1999 (CN) .......................................... 99118481

(51) Int. Cl.[7] .................. G01R 11/63; G01R 19/22; H03K 11/00
(52) U.S. Cl. ................. 324/103 P; 324/119; 327/104
(58) Field of Search ................. 324/606, 119, 324/103 P; 327/104, 122, 102, 351; 330/10, 149; 363/86, 87, 89

(56) References Cited

U.S. PATENT DOCUMENTS 4,564,814 A * 1/1986 Miura et al. ................ 327/104

OTHER PUBLICATIONS

"Mixed–Signal Design Seminar", Copyright ©1991 by Analog Devices, Inc., pp. II–3 and II–4. Missing w/out.
"nonlinear circuits handbook", by The Engineering Staff of Analog Devices, Inc., Norwood, Massachusetts, Copyright ©1976 and 1974, Second Edition Jan., 1976, 6 7 8, pp. 132–134.
*Intuitive IC Op AMPS*, "Some of the Key Op Amp Application Circuits" Thomas M. Frederiksen, pp. 213, ©1984.

* cited by examiner

Primary Examiner—N. Le
Assistant Examiner—James Kerveros
(74) *Attorney, Agent, or Firm*—Lisa K. Jorgenson; William I. Kubida

(57) ABSTRACT

A temperature stable, integrated circuit full wave level detector incorporating a single stage operational amplifier design which does not require, as in prior art implementations, two operational amplifiers to perform a full wave rectification function on an input alternating current ("AC") signal followed by a comparator to detect the resultant signal level. The full wave level detector of the present invention utilizes but a single amplifier and some additional peripheral components resulting in a saving in on-chip die area in an integrated circuit ("IC") implementation while also exhibiting excellent temperature stability characteristics.

22 Claims, 4 Drawing Sheets

TEMPERATURE STABLE INTEGRATED CIRCUIT FULL WAVE LEVEL DETECTOR INCORPORATING A SINGLE OPERATIONAL AMPLIFIER STAGE DESIGN

BACKGROUND OF THE INVENTION

The present invention relates, in general, to the field of nonlinear integrated circuit ("IC") devices. More particularly, the present invention relates to a temperature stable, integrated circuit full wave level detector incorporating a single operational amplifier stage and which does not require full wave rectification of an alternating current ("AC") input signal or a comparator to detect the resultant signal level.

Conventional implementations of a full wave level detector utilize a pair of series coupled operational amplifiers to perform a full wave rectification of an input AC signal. Typical of such full wave rectification circuits are those described in Frederickson, T. M., Intuitive *Op Amps*, p. 213; Sheingold, D. H., *Nonlinear Circuits Handbook* pp. 132–134, Analog Devices, 1976; *Mixed Signal Design Seminar*, "Linear and Non-Linear Analog Signal Processing", Analog Devices, 1991.

In a conventional full wave level detector, the output of such a full wave rectifier circuit is then applied to one input of a comparator which has its other input tied to a predetermined reference voltage level. As is well known, a comparator is a device that has two stable output states and in this instance is used to provide a predetermined signal output level when an input voltage from the full wave rectifier circuit has crossed a threshold voltage determined by the value of the reference voltage. While using two such operational amplifiers together with a single comparator provides full wave level detector functionality, the need for the initial full wave rectification step necessitates the use of an undesirably large number of circuit elements requiring the commitment of a concomitantly large on-chip die area in an integrated circuit implementation. Moreover, due to the functionality and design of such circuits, less than optimal temperature stability may be exhibited over at least a portion of the range of possible integrated circuit device operational temperatures.

SUMMARY OF THE INVENTION

A full wave level detector circuit is disclosed which does not require, as in prior art implementations, two operational amplifiers to perform a full wave rectification function on an input AC signal followed by a comparator to detect the resultant signal level. The full wave level detector of the present invention utilizes but a single amplifier in conjunction with some additional peripheral components resulting in a saving in valuable on-chip die area in an integrated circuit implementation while also exhibiting excellent temperature stability characteristics.

Particularly disclosed herein is a full wave level detector having an input node for receiving an input signal and an output node for providing a corresponding output signal. The detector comprises an amplifier coupled to receive the input signal through a first resistor ($R_1$) on an input terminal thereof; first and second switching devices having control terminals thereof coupled to the input terminal of the amplifier and second ($R_2$), third ($R_3$) and fourth ($R_4$) resistors coupled to an output terminal of the amplifier, with the second resistor being coupled to the input terminal of the amplifier and the third and fourth resistors being respectively coupled to a first current carrying terminal of the first and second switching devices. The detector further comprises a first current mirror having first and second legs thereof respectively coupling a second current carrying terminal of each of the first and second switching devices to a first supply voltage source, with the second current carrying terminal of the second switching device defining a circuit node. A second current mirror has first and second legs thereof, with the first leg thereof coupling a second supply voltage source to the circuit node while a third current mirror has first and second legs thereof respectively coupled through a fifth resistor ($R_5$) to a reference voltage source and the second leg thereof coupled to the second leg of the second current mirror. An output driver couples the circuit node to the output node.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
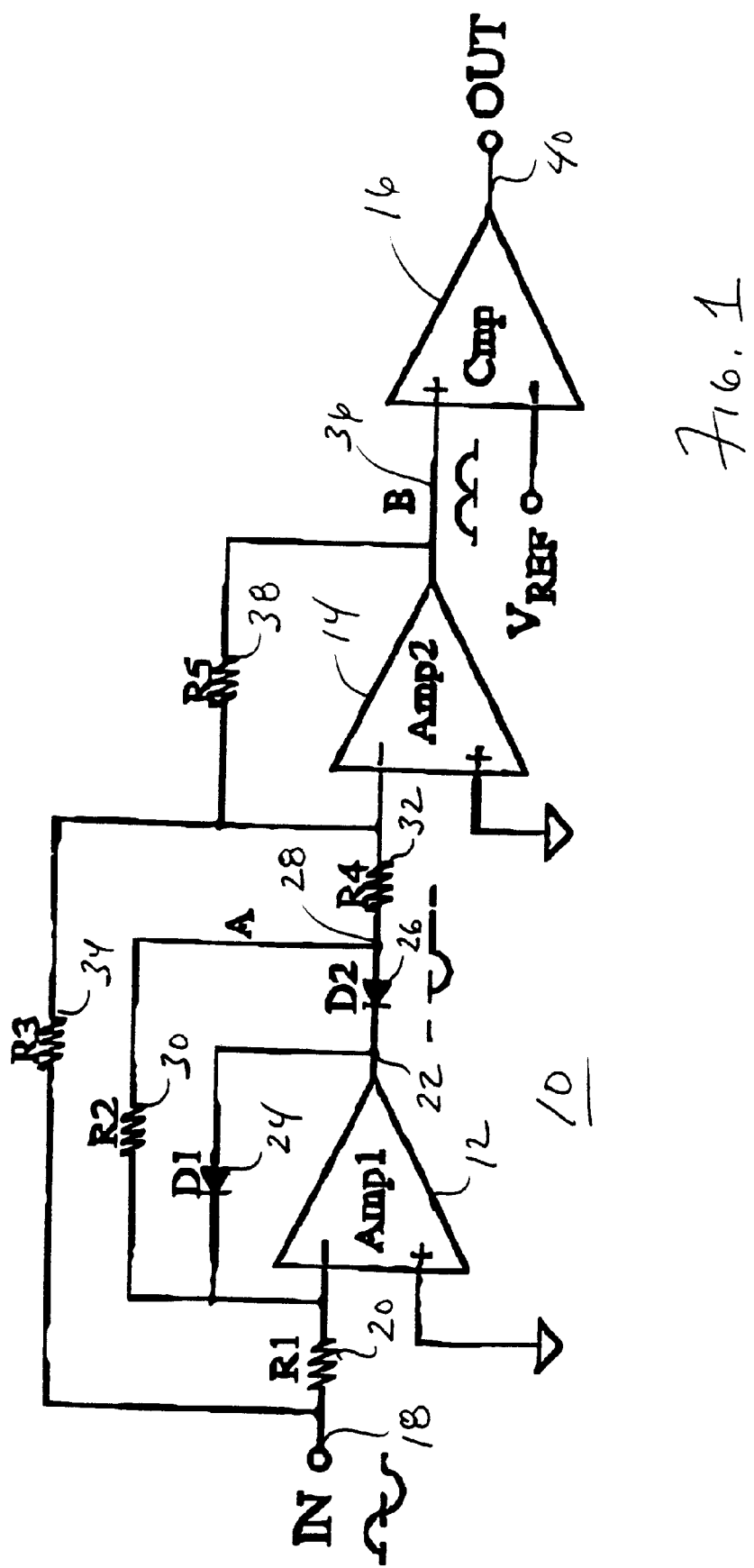
FIG. 1 is a functional block and schematic illustration of a conventional full wave level detector circuit requiring a minimum of two amplifiers and a comparator provide the requisite functionality.

With reference now to FIG. 1, a conventional full wave level detector circuit 10 is shown. The full wave level detector circuit 10 comprises, in pertinent part, a full wave rectifier comprising operational ("OP") amplifiers 12 and 14 which provides a full wave rectified output signal to a comparator 16. An input node 18 receives a substantially sinusoidal input signal which is applied to the inverting input of the amplifier 12 through resistor 20 ("$R_1$"). The output of amplifier 12 on node 22 is coupled back to its inverting input by means of a diode 24 ("$D_1$") which has its anode coupled to the node 22 and its cathode coupled to the inverting input of the amplifier 12.

The output of the amplifier 12 at node 22 is coupled to the cathode of another diode 26 ("$D_2$"), the anode of which defines a node 28 (Node "A") which is also coupled back to the inverting input of the amplifier 12 through resistor 30 ("$R_2$"). The node 28 at the anode of diode 26 is coupled through resistor 32 to the inverting input of another amplifier 14. Both amplifiers 12 and 14 have their non-inverting inputs coupled to circuit ground. The inverting input of the amplifier 14 is coupled to the input node 18 by means of resistor 34 ("$R_3$") and the output of the amplifier 14 at node 36 is coupled back to the inverting input by means of resistor 38 ("$R_5$"). As shown, the output of the amplifier 14 is supplied to the positive input of the comparator 16 which has its negative input coupled to a reference voltage source ("$V_{REF}$"). The output of the comparator 16 defines an output node 40.

In operation, the values for the various resistors may be defined as:

$$R_1=R_2=R_3=R_5=R \text{ and } R_4=R/2 \tag{1}$$

When the input signal at the input node 18 is undergoing a positive voltage transition, the diode $D_1$ is reverse biased "off" while the diode $D_2$ is forward biased "on". As a result, the output signal appearing at node 36 (Node "B") is:

$$V_B=V_{in}[(-R_2/R_1)(-R_5/R_4)+(-R_5/R_3)]=V_{in} \tag{2}$$

Alternatively, when the input signal at the input node 18 is undergoing a negative voltage transition, the diode $D_1$ is forward biased "on" and the diode $D_2$ is reverse biased "off". Consequently, the signal at node 36 is:

$$V_B=V_{in}(-R_5/R_3)=-V_{in} \tag{3}$$

Over one full cycle of the input signal at the input node 18, the voltage at node B is then:

$$V_B=|V_{in}| \tag{4}$$

The comparator 16 coupled to the output of the amplifier 14 at node 36 functions to compare the voltage at its input $V_B$ with $V_{REF}$, where the voltage $V_{REF}$ is a predefined voltage level for the conventional full wave level detector circuit 10.

Figure 2:
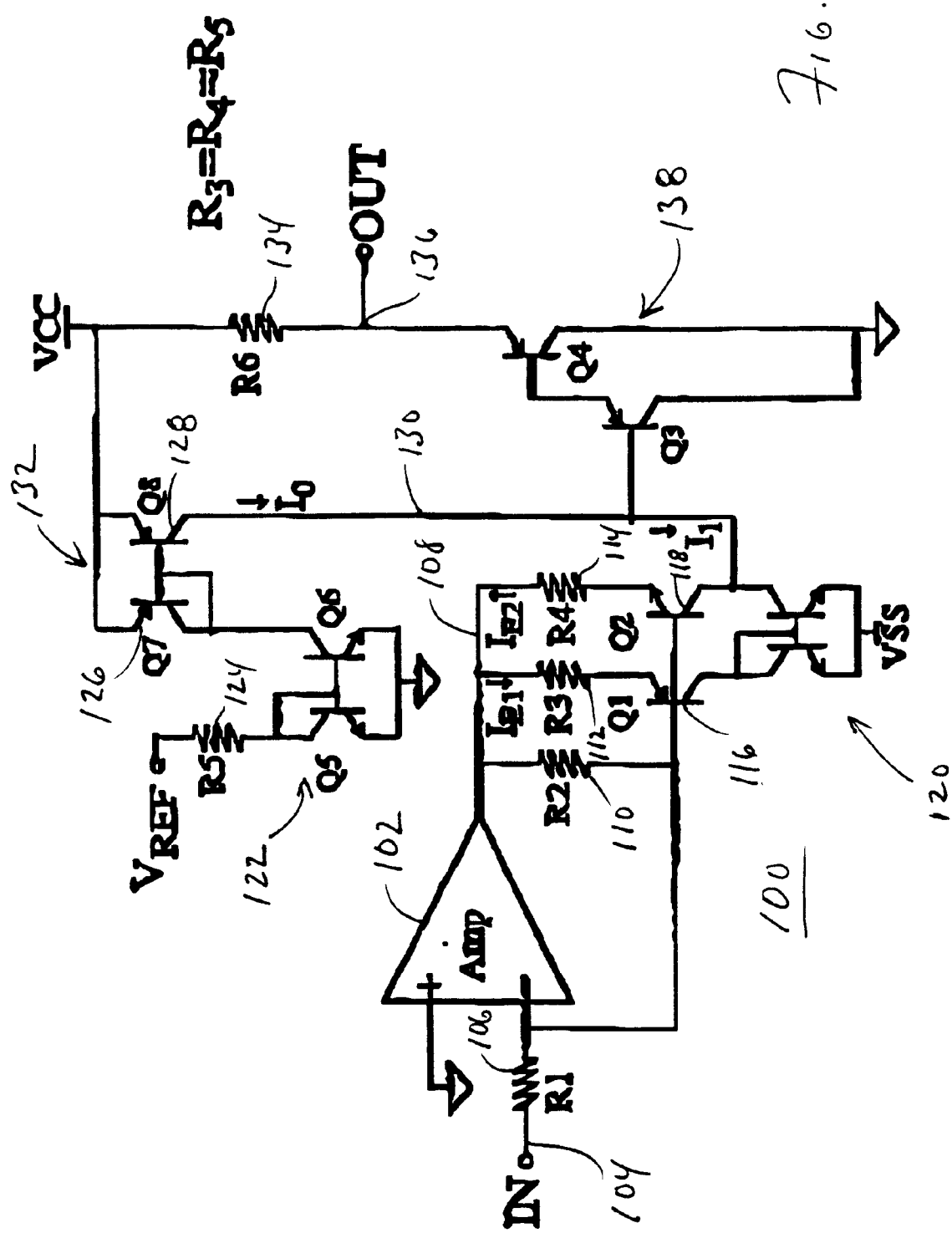
FIG. 2 is a functional block and schematic illustration of a full wave level detector in accordance with an embodiment of the present invention which requires but a single amplifier and some peripheral components to provide requisite functionality.

With reference additionally now to FIG. 2, a full wave level detector 100 in accordance with the present invention is shown. The full wave level detector 100 comprises but a single amplifier 102 as shown with some additional peripheral components resulting in a comparatively simple circuit design which uses less components than the conventional full wave level detector 10 of FIG. 1 and which further provides excellent operational stability over a range of temperatures.

The full wave level detector 100 has an input node 104 for receiving, for example, a substantially sinusoidal input signal which is applied to the inverting input of the amplifier 102 through a resistor 106 ("$R_1$"). The non-inverting input of the amplifier 102 may be connected to circuit ground as shown. The output of the amplifier 102 on node 108 is coupled back to its inverting input by means of resistor 110 ("$R_2$") as well as being coupled to the emitter of PNP transistor 116 ("$Q_1$") through resistor 112 ("$R_3$") and to the emitter of NPN transistor 118 ("$Q_2$") through resistor 114 ("$R_4$"). The base terminals of the transistors 116 and 118 are coupled to the inverting input of the amplifier 102 and have their respective collector terminals coupled to one side of a current mirror 120 coupled, in turn, to a supply voltage source $V_{SS}$. The current through resistor 112 ("$I_{E1}$") and the corresponding current through resistor 114 ("$I_{E2}$") are respectively in the directions indicated by the arrows.

An additional current mirror 122 (comprising NPN transistors $Q_5$ and $Q_6$) has one input thereof coupled to receive a reference voltage ("$V_{REF}$") through a resistor 124 ("$R_5$") while the other input is coupled through one leg of another current mirror 132 comprising PNP transistors 126 and 128 which have their respective emitters coupled to a supply voltage source $V_{CC}$. The collector terminal of transistor 128 defines a node 130 which is connected to the collector terminal of transistor 118 as well as to the base terminal of an output driver circuit 138, in the embodiment illustrated comprising a Darlington transistor pair (comprising PNP transistors $Q_3$ and $Q_4$). The current through transistor 128 on node 130 ("$I_0$") is in the direction shown as is the collector current ("$I_1$") into the transistor of the current mirror 120 coupled thereto.

Output of the full wave level detector 100 is taken at output node 136 which is coupled to $V_{CC}$ through resistor 134 ("$R_6$") and to $V_{SS}$ by means of the Darlington transistor pair output driver circuit 138. The values of resistors 112, 114 and 124 are selected to be equal as shown.

In operation then, the current across resistor $R_5$ may be defined as:

$$I_{R5}=(V_{REF}-V_{BE})/R_5 \tag{5}$$

This current will be mirrored to the current $I_o$ at node 130.

The amplifier 102, and resistors 106 and 110 ($R_1$ and $R_2$) implement a conventional inverting amplifier. In the instance where the equivalent impedance from the base of transistors 116 and 118 ($Q_1$ and $Q_2$) is much larger than that of the resistor 110 ($R_2$), then the voltage across $R_2$ may be defined as:

$$V_{R2}=-V_{in}(R_2/R_1) \tag{6}$$

If the voltage $V_{R2}$ is relatively small, then transistors 116 and 118 ($Q_1$ and $Q_2$) will not turn "on". In fact, only if $|V_{R2}|$ is larger than $V_{BE}$, will transistors 116 and 118 ($Q_1$ or $Q_2$) turn "on". At this time, if $-V_{R2}-V_{BE}>0$, transistor 116 ($Q_1$) will turn "on". On the other hand, if $-V_{R2}-V_{BE}>0$, then transistor 118 ($Q_2$) will turn "on". As a result, the voltage across resistor 110 ($R_2$) can then be represented by the equation:

$$V_{R2}=V_{BE}+I_{E1}R_3 \tag{7}$$

or $$V_{R2}=-V_{BE}-I_{E2}R_4 \tag{8}$$

The currents $I_{E1}$ or $I_{E2}$ will themselves introduce a current $I_1$. When $I_1>I_0$, the extra current will supply the base of the Darlington transistor pair 136 ($Q_3$ and $Q_4$) and it cause the output at the output node 136 to change state.

When $I_0=I_1$, the voltage across $R_2$ is:

$$V_{R2}=V_{BE}+I_0R_3 \tag{9}$$

or $$V_{R2}=-V_{BE}-I_0R_3 \tag{10}$$

The current $I_0$ is:

$$I_0=I_{R5}=(V_{REF}-V_{BE})/R_5 \tag{11}$$

From this equation it can be seen that:

$$V_{BE}=V_{REF}-I_0R_5 \tag{12}$$

Substituting equation 12 into equation 9 and 10, the following results:

$$V_{R2}=V_{REF}+I_0(R_3-R_5) \tag{13}$$

or $$V_{R2}=-V_{REF}-I_0(R_4-R_5) \tag{14}$$

If, as previously stated, the resistors 112, 114 and 124 are chosen such that $R_3=R_4=R_5$, one obtains:

$|V_{R2}|=V_{REF}$ (15)

So, when $|V_{R2}|<V_{REF}$, there is no extra current to supply the Darlington transistor pair 138 and the output node 136 is driven "high". However, when $|V_{R2}|>V_{REF}$, the extra current will then drive the Darlington transistor pair 138 so as to make the output transition to a "low" state.

Stated another way, since $|V_{R2}|=|V_{in}|(R_2/R_1)$, when:

$|V_{in}|<(R_1/R_2)V_{REF}$ the output is "high" (16)

and $|V_{in}|>(R_1/R_2)V_{REF}$ the output is "low". (17)

Since the value of $(R_1/R_2)V_{REF}$ is insensitive to temperature change, $V_{REF}$ would be a bandgap voltage in a preferred embodiment, the full wave level detector 100 of the present invention will also exhibit excellent performance stability over a wide range of temperatures.

Figure 3:
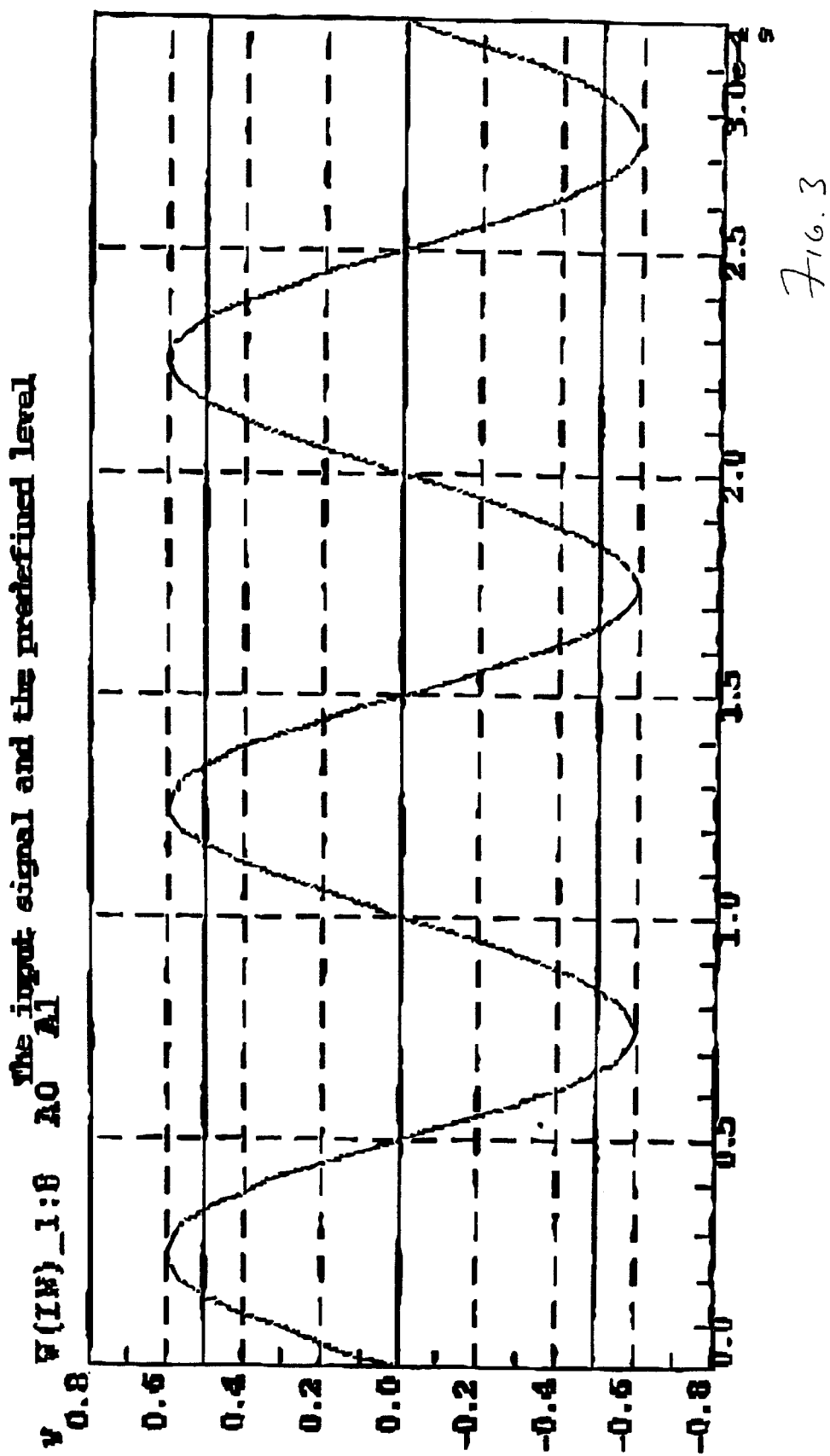
FIG. 3 a representative input signal waveform of 0.6 volts amplitude is shown for input to the full wave level detector of FIG. 2 having a predefined detecting level of 0.5 volts and with the reference voltage $V_{REF}$ set to 1.25 volts.

With reference additionally now to FIG. 3, a simulated input signal waveform which may be applied to input node 104 ("$V_{IN}$") of the full wave level detector 100 of FIG. 2 is shown plotted as voltage versus time. The input is a substantially sinusoidal wave of +/−0.6 volts in amplitude. The predefined detecting level is set at 0.5 volts with the reference voltage $V_{REF}$ set to 1.25 volts. Resistor values were selected as follows: $R_1$=2 Kohms; $R_2$=5 Kohms; $R_3$=$R_4$= $R_5$=10 Kohms with $V_{CC}$=+5 volts and $V_{SS}$=−5 volts.

Figure 4:
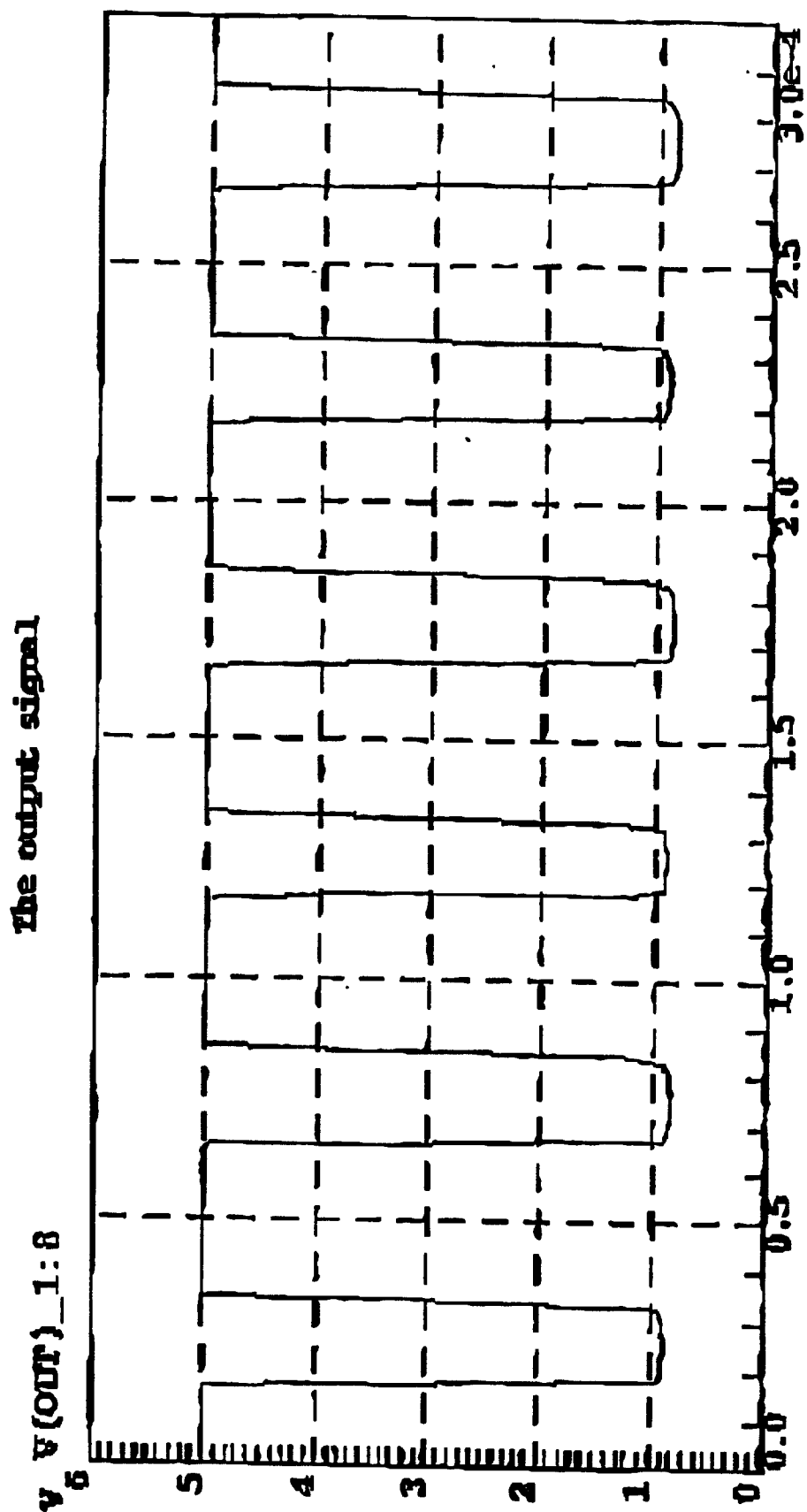
FIG. 4 is a representative output signal waveform for the full wave level detector of FIG. 2 when the input signal of FIG. 3 is applied thereto.

With reference additionally now to FIG. 4, the output signal waveform taken at the output node 136 of the full wave level detector 100 of FIG. 2 is shown in response to the input signal of FIG. 3. The output signal waveform is plotted as voltage versus time and shows the voltage level at the output node 136 ("$V_{OUT}$") as varying between a level of 5.0 volts and substantially 0.9 volts while exhibiting very rapid rise and fall times therebetween.

While there have been described above the principles of the present invention in conjunction with a specific circuit implementation utilizing bipolar transistors it is to be clearly understood that the foregoing description is made only by way of example and not as a limitation to the scope of the invention which may also be implemented in other analogous ways including those that might use of MOS transistors. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A full wave level detector having an input node for receiving an input signal and an output node for providing a corresponding output signal, said detector comprising:

an amplifier coupled to receive said input signal through a first resistor (R1) on an input terminal thereof;

first and second switching devices having control terminals thereof coupled to said input terminal of said amplifier;

second (R2), third (R3) and fourth (R4) resistors coupled to an output terminal of said amplifier, said second resistor being coupled to said input terminal of said amplifier and said third and fourth resistors being respectively coupled to a first current carrying terminal of said first and second switching devices;

a first current mirror having first and second legs thereof respectively coupling a second current carrying terminal of each of said first and second switching devices to a first supply voltage source, said second current carrying terminal of said second switching device defining a circuit node;

a second current mirror having first and second legs thereof, said first leg thereof coupling a second supply voltage source to said circuit node;

a third current mirror having first and second legs thereof respectively coupled through a fifth resistor (R5) to a reference voltage source and said second leg thereof coupled to said second leg of said second current mirror; and an output driver coupling said circuit node to said output node and providing said output signal to the output node, wherein said output signal is at a first logic level when an absolute value of said input signal is less than R1/R2 times said reference voltage and wherein said output signal is at a second logic level when an absolute value of said input signal is greater than R1/R2 times said reference voltage.

2. The full wave level detector of claim 1 wherein said amplifier comprises an operational amplifier.

3. The full wave level detector of claim 2 wherein said input terminal comprises an inverting input of said operational amplifier.

4. The full wave level detector of claim 3 wherein said operational amplifier further comprises a non-inverting input thereof coupled to a circuit ground potential.

5. The full wave level detector of claim 1 wherein said first and second switching devices comprise bipolar transistors.

6. The full wave level detector of claim 1 wherein said first and second switching devices comprise PNP and NPN transistors respectively.

7. The full wave level detector of claim 1 wherein said first current carrying terminals of said first and second switching devices comprise emitter terminals.

8. The full wave level detector of claim 1 wherein said first current mirror comprises a pair of NPN transistors coupling collector terminals of said first and second switching devices to said first supply voltage source.

9. The full wave level detector of claim 1 wherein said second current mirror comprises a pair of PNP transistors.

10. The full wave level detector of claim 1 wherein said third current mirror comprises a pair of NPN transistors.

11. The full wave level detector of claim 1 wherein said output driver comprises a Darlington transistor pair having a control terminal thereof coupled to said circuit node and a first current carrying terminal coupled to said output node a second current carrying terminal coupled to a circuit ground potential.

12. The full wave level detector of claim 11 wherein said output driver further comprises a sixth resistor ($R_6$) coupling said output node to said second supply voltage source.

13. The full wave level detector of claim 1 wherein said third, fourth and fifth resistors have substantially equal resistances.

14. The full wave level detector of claim 13 wherein $R_3$, $R_4$ and $R_5$ are substantially 10 Kohms.

15. The full wave level detector of claim 1 wherein said output signal is at a first logic level when an absolute value of said input signal is less than $R_1/R_2$ times said reference voltage.

16. The full wave level detector of claim 14 wherein said output signal is at a second logic level when an absolute value of said input signal is greater than $R_1/R_2$ times said reference voltage.

17. The full wave level detector of claim 1 wherein $R_1$ is substantially 2 Kohms and $R_2$ is substantially 5 Kohms.

18. The full wave level detector of claim 1 wherein said first supply voltage source is substantially −5.0 volts.

19. The full wave level detector of claim 1 wherein said second supply voltage source is substantially +5.0 volts.

20. The full wave level detector of claim 1 wherein said reference voltage source is substantially 1.25 volts.

21. A full wave level detector having an input node for receiving an input signal and an output node for providing a corresponding output signal that is not full wave rectified, comprising:

an operational amplifier coupled to receive said input signal from the input node on an inverting input terminal thereof;

first and second switching devices having control terminals thereof coupled to said input terminal of said amplifier;

resistor means coupled to an output terminal of said amplifier, to said input terminal of said amplifier, and to a first current carrying terminal of said first and second switching devices;

a first current mirror having first and second legs thereof respectively coupling a second current carrying terminal of each of said first and second switching devices to a first supply voltage source, said second current carrying terminal of said second switching device defining a circuit node;

a second current mirror having first and second legs thereof, said first leg thereof coupling a second supply voltage source to said circuit node;

a third current mirror having first and second legs thereof respectively coupled through a fifth resistor ($R_5$) to a reference voltage source and said second leg thereof coupled to said second leg of said second current mirror; and an output driver coupling said circuit node to said output node providing said output signal and changing a state of said output signal when a current on said second current carrying terminal of said second switching device is greater that a current provided by said second current mirror.

22. A level detector having an input node for receiving an input signal and an output node for providing a corresponding output signal, comprising:

an amplifier coupled to receive said input signal from the input node thereof through a first resistor ($R_1$);

first and second switching devices having control terminals thereof coupled to said input terminal of said amplifier, wherein said first and second switching devices comprise PNP and NPN transistors respectively;

second ($R_2$), third (R3), and fourth (R4) resistors coupled to an output terminal of said amplifier, said second resistor being coupled to said input terminal of said amplifier and said third and fourth resistors being respectively coupled to a first current carrying terminal of said first and second switching devices;

a first current mirror having first and second legs thereof respectively coupling a second current carrying terminal of each of said first and second switching devices to a first supply voltage source, said second current carrying terminal of said second switching device defining a circuit node;

a second current mirror having first and second legs thereof, said first leg thereof coupling a second supply voltage source to said circuit node;

a third current mirror having first and second legs thereof respectively coupled through a fifth resistor ($R_5$) to a reference voltage source and said second leg thereof coupled to said second leg of said second current mirror; and an output driver coupling said circuit node to said output node;

wherein said third, fourth and fifth resistors have substantially equal resistances and wherein said output signal is at a first logic level when an absolute value of said input signal is less than $R_1/R_2$ times said reference voltage and at a second logic level when an absolute value of said input signal is greater than $R_1/R_2$ times said reference voltage.

* * * * *